(12) United States Patent
Elkin et al.

(10) Patent No.: US 11,169,779 B2
(45) Date of Patent: Nov. 9, 2021

(54) FULL ADDER CELL WITH IMPROVED POWER EFFICIENCY

(71) Applicant: NVIDIA Corp., Santa Clara, CA (US)

(72) Inventors: Ilyas Elkin, Sunnyvale, CA (US); Ge Yang, Pleasanton, CA (US); Xi Zhang, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 75 days.

(21) Appl. No.: 16/803,795

(22) Filed: Feb. 27, 2020

(65) Prior Publication Data

US 2021/0124558 A1   Apr. 29, 2021

Related U.S. Application Data

(63) Continuation-in-part of application No. 16/661,888, filed on Oct. 23, 2019.

(51) Int. Cl.
| | | |
|---|---|---|
| *G06F 7/501* | (2006.01) | |
| *G06F 9/30* | (2018.01) | |
| *G06F 7/575* | (2006.01) | |
| *G06F 7/509* | (2006.01) | |
| *G06F 7/533* | (2006.01) | |
| *H03K 19/21* | (2006.01) | |
| *G06F 7/53* | (2006.01) | |

(52) U.S. Cl.
CPC .............. *G06F 7/501* (2013.01); *G06F 7/575* (2013.01); *G06F 9/3001* (2013.01); *G06F 9/30029* (2013.01); *G06F 7/509* (2013.01); *G06F 7/5318* (2013.01); *G06F 7/5338* (2013.01); *H03K 19/215* (2013.01)

(58) Field of Classification Search
CPC .. G06F 7/50–509; G06F 7/575; G06F 7/5318; G06F 7/5338; G06F 9/3001; G06F 9/30029; H03K 19/20–217
See application file for complete search history.

(56) References Cited

U.S. PATENT DOCUMENTS

| | | | | |
|---|---|---|---|---|
| 4,864,528 A * | 9/1989 | Nishiyama | ............ | G06F 7/4824 708/493 |
| 5,267,187 A * | 11/1993 | Hsieh | ....................... | G06F 7/503 708/700 |
| 5,818,747 A * | 10/1998 | Wong | .................... | G06F 7/5045 708/702 |
| 2005/0203983 A1 * | 9/2005 | Chirca | .................... | G06F 7/506 708/700 |
| 2020/0394017 A1 * | 12/2020 | Fritz | ....................... | G06F 7/607 |

OTHER PUBLICATIONS

J Trommer, et al., Functionality-Enhanced Logic Gate Design Enabled by Symmetrical Reconfigurable Silicon Nanowire Transistors, IEEE Transactions on Nanotechnology, vol. 14, No. 4, 2015 (Year: 2015).*

(Continued)

*Primary Examiner* — Emily E Larocque
(74) *Attorney, Agent, or Firm* — Rowan TELS LLC

(57) ABSTRACT

An adder circuit provides a first operand input and a second operand input to an XNOR cell. The XNOR cell transforms these inputs to a propagate signal that is applied to an OAT cell to produce a carry out signal. A third OAT cell transforms a third operand input and the propagate signal into a sum output signal.

19 Claims, 16 Drawing Sheets

(56) References Cited

OTHER PUBLICATIONS

J.M. Rabaey et al, Digital Integrated Circuits, Designing Combinational Logic Circuits, Digital Integrated Circuits, 2002 (Year: 2002).*
"Digital Integrated Circuits, A Design Perspective" by Jan M. Rabaey, 1996.
"Digital Integrated Circuits", Lecture 20 on Adders, EE141, Fall 2010.
"Principles of CMOS VLSI design: A Systems Perspective" by N. Weste and K. Eshragian, Apr. 1993.

* cited by examiner

FULL ADDER CELL WITH IMPROVED POWER EFFICIENCY

CROSS REFERENCE TO RELATED APPLICATIONS

This application claims priority and benefit as a continuation-in-part of U.S. application Ser. No. 16/661,888, titled "Multiplier Compressor with Improved Power Efficiency", filed on Oct. 23, 2019, the contents of which are incorporated herein by reference in their entirety.

FIELD

This disclosure related to adder circuits and more specifically to full adder circuits utilized in compressor circuits.

BACKGROUND

Single bit full adder circuits are common, basic building blocks for complex digital logic circuitry. "Adder circuit" refers to a circuit that transforms two or more input bits into a sum output bit and a carry out bit. "Full adder" refers to an adder circuit that adds three bits—two operands and a carry in, to generate a sum bit (sum output) and a carry out bit. A full adder is contrasted with a half adder, which only operates on two operands to generate the sum output and carry out. Full adders may be implemented as standalone circuits on simple integrated circuit (IC) chips, or may be used in the tens, hundreds, or thousands as logical sub-components on large, complex ICs.

Full adder logic may be implemented using multiple transistors. These transistors may be arranged and configured as inverters, pass gates, AND gates, OR gates, XOR gates, and other basic logical gates. "Pass gate" refers to a circuit that selectively blocks or passes a signal level from its input terminal to its output terminal as controlled by a signal at its control terminal. A pass gate may be implemented using a pMOS transistor and an nMOS transistor where the control terminals (gates) of each are biased in a complementary manner so that both transistors are either ON or OFF simultaneously. Hundreds of full adders may therefore require thousands of transistors, taking up significant space on a chip.

As the electronics industry works to meet the demand for more logical power in smaller form factors, lower power consumption, and faster timing response, there is a need to reduce the size, power consumption, and timing of basic logic building blocks such as the full adder.

A full adder circuit generates a sum and a carry out bit. Generating the sum may be carried out using a three-input XOR logic gate. The carry out CO is generated from the adder input operands A and B, and the adder input carry in CI from a previous addition operation. Full adder circuits may be combined into tree structures to add operands comprising a large number of bits. Full adder circuits in such a tree may input four operands and a carry-in, and output a sum and carry to a full adder in a next level of the tree as well as a carry-out to a next full adder in the same level of the tree. A full adder of this type is referred to as a 4:2 compressor. A 4:2 compressor-based four bit adder circuit 100 implemented by two three byte adders is depicted in FIG. 1, and an adder tree 200 formed using such four byte adders is depicted in FIG. 2. A conventional full adder circuit 300 is depicted in FIG. 3 and a conventional 4:2 compressor 400 is depicted in FIG. 4. "Compressor circuit" refers to a circuit that reduces a number N of input bits to a number M of output bits, where M<N.

A high percentage of the power consumed by full adder circuits for large operands is used in the tree of compressor cells used in such adders. Many solutions have been explored to improve the power consumption of such trees, but it has proven difficult to improve on legacy mirror-style CMOS full adder cells, which have a regular layout and good internal switching activities. Other attempted solutions suffer from poor layout, unacceptably high delays, or poor output drive strengths.

BRIEF SUMMARY

This disclosure relates to an adder circuit. The adder circuit comprises a first operand input and a second operand input to an XNOR cell. The XNOR cell may be configured to provide the first operand input and the second operand input to both a NAND gate and a first OAI cell. A second OAI cell may transform the output of the XNOR cell into a carry out signal.

This disclosure further relates to a compressor circuit comprising a full adder and a second full adder. Each full adder comprises a first operand input and a second operand input to both of a NAND gate and a first OAI cell. Each full adder additionally comprises a second OAI cell that may transform the outputs of the NAND gate and the first OAI cell into a carry out signal.

This disclosure also relates to an adder circuit comprising an XNOR cell, a pass gate, and an output stage at the output of the pass gate. The XNOR cell may be configured to transform a first operand input and a second operand input into a propagate signal applied to each of the pass gate, the output stage, and an OAI cell.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
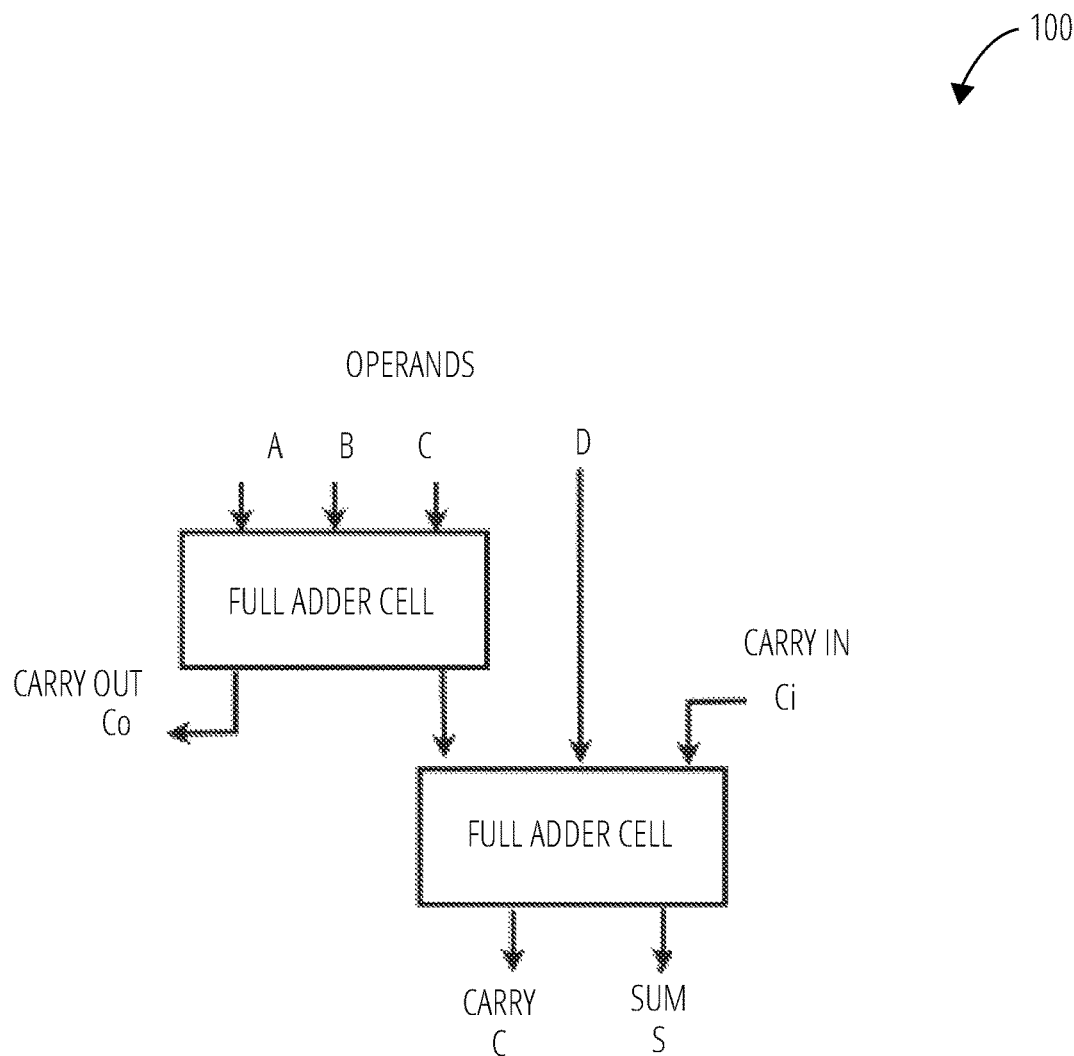
FIG. 1 depicts a four bit adder circuit 100 in accordance with one embodiment.
Figure 2:
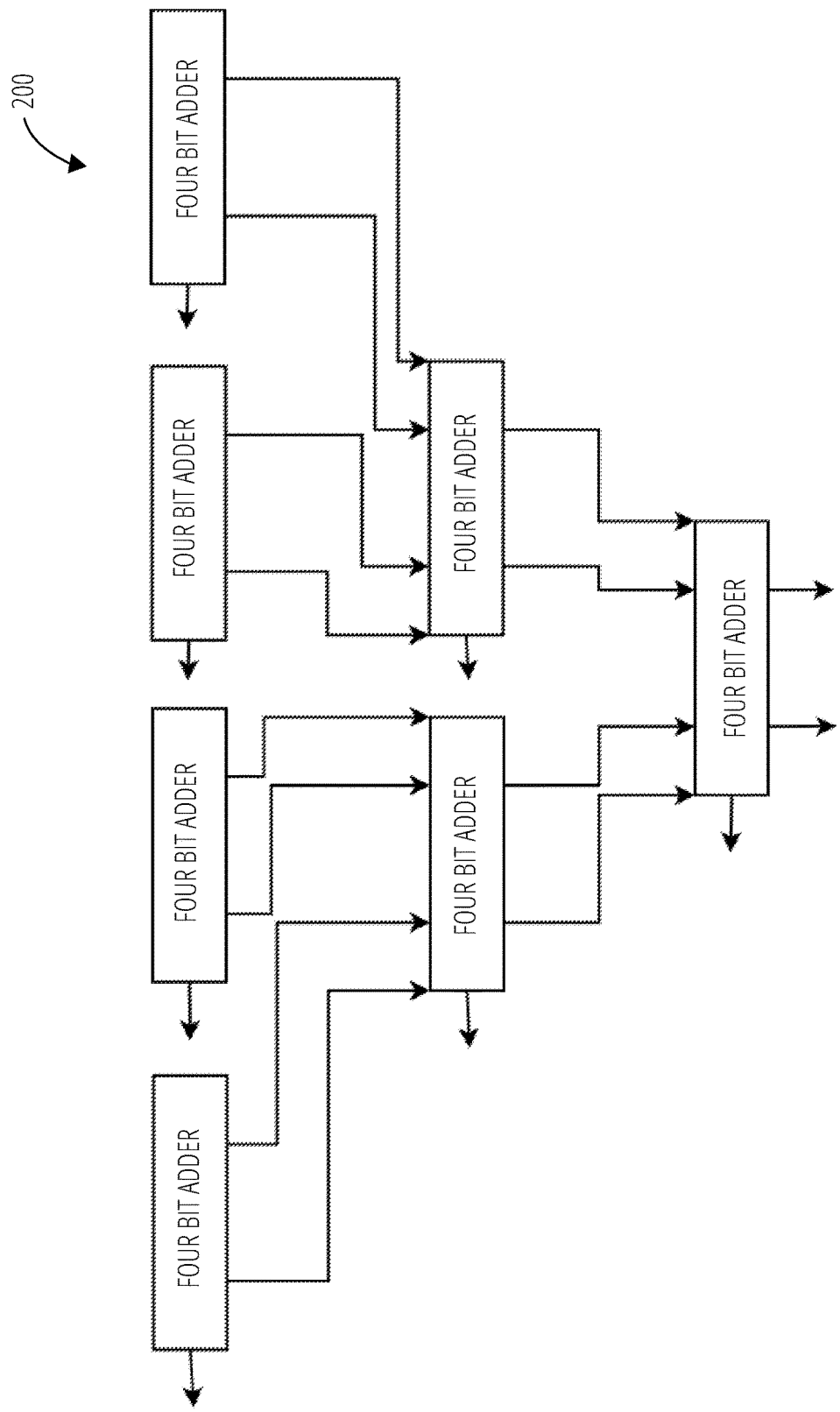
FIG. 2 depicts an adder tree 200 in accordance with one embodiment.
Figure 3:
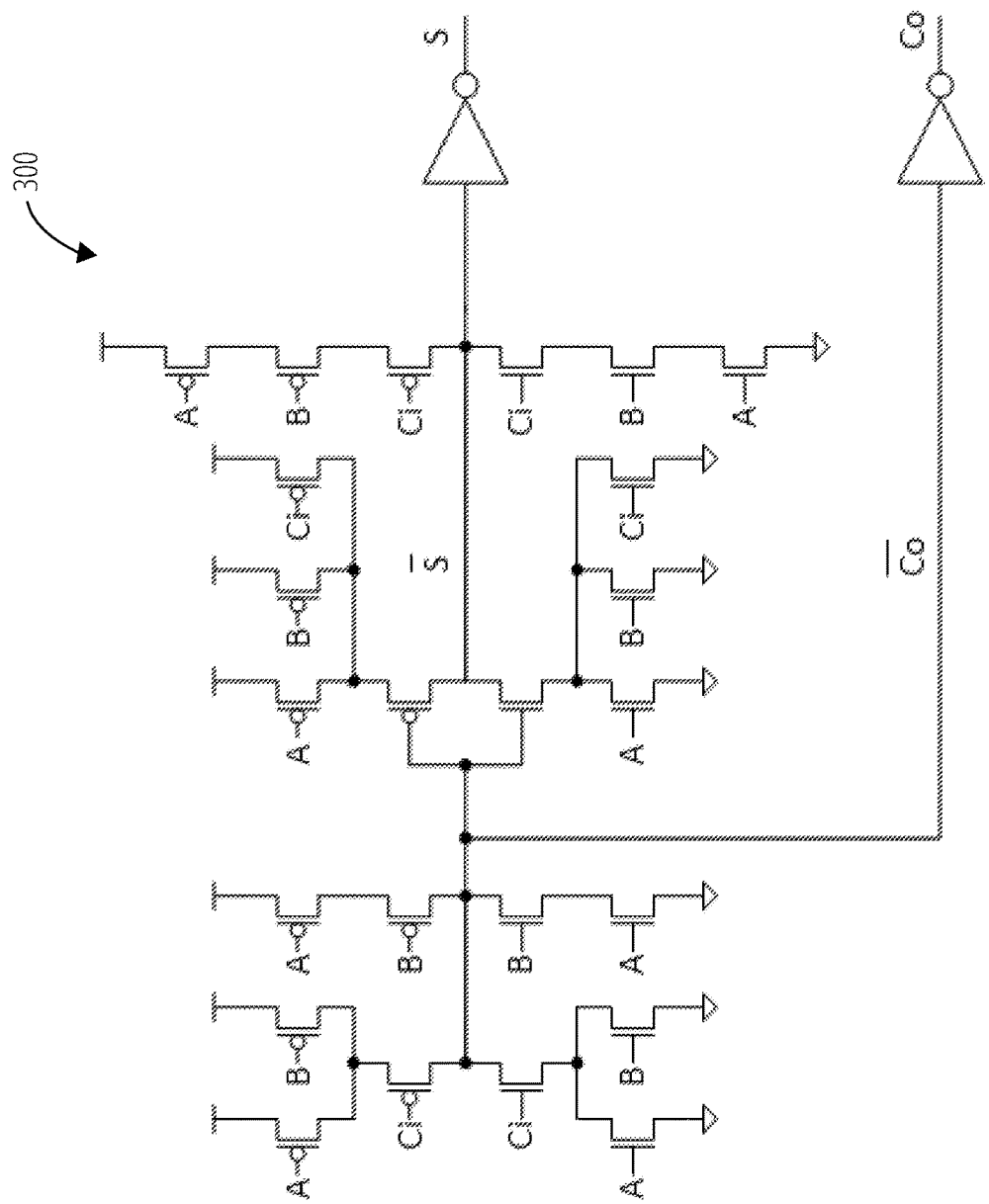
FIG. 3 depicts a conventional full adder circuit 300 in accordance with one embodiment.
Figure 4:
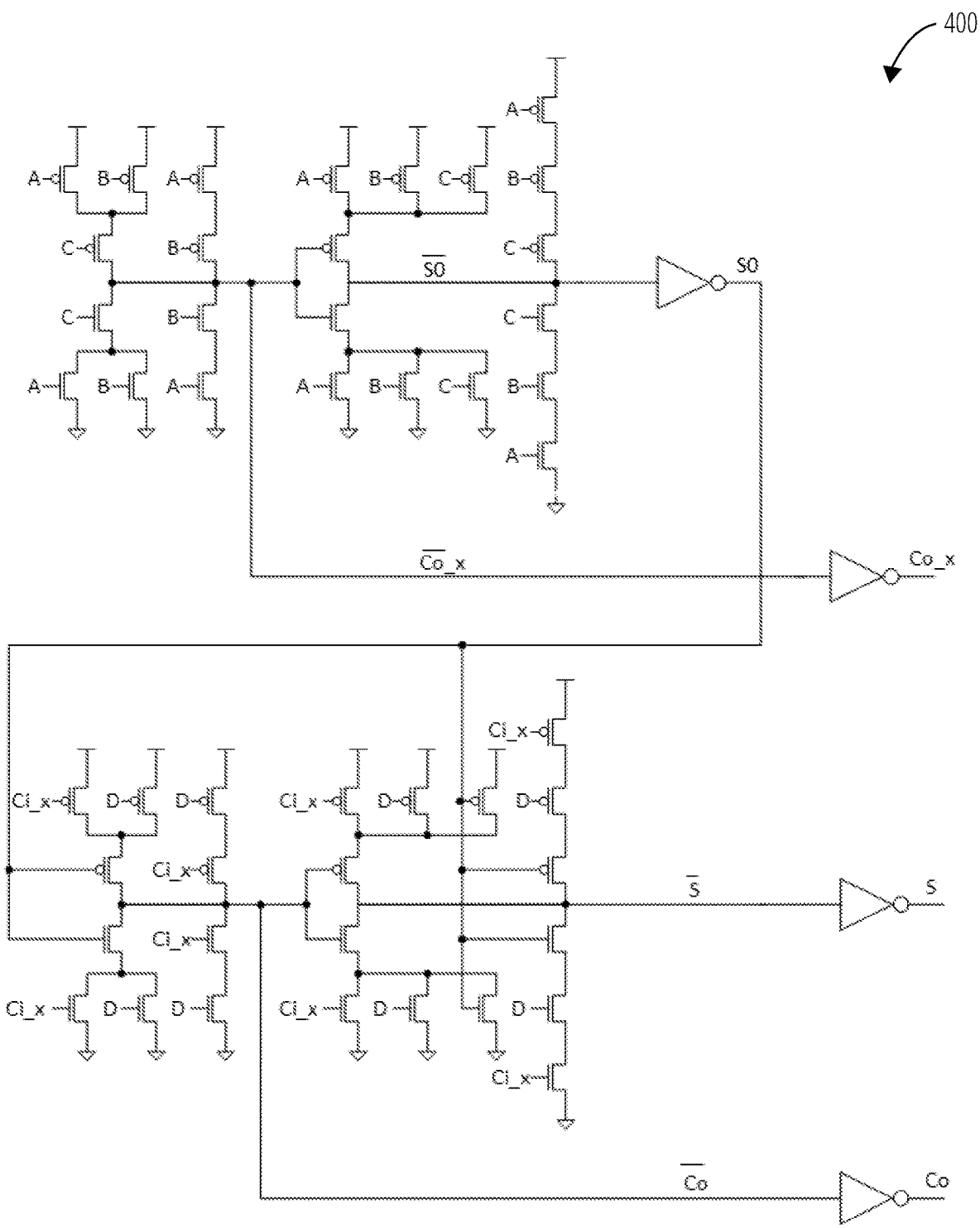
FIG. 4 depicts a conventional 4:2 compressor 400 in accordance with one embodiment.

Embodiments of a full adder circuit (also referred to as a full adder cell) are disclosed utilizing a first-stage two-input exclusive NOR gate of A and B inputs implemented as a two-input NAND gate (NAND2) combined with an OR-AND-INVERTER (OAI21) cell. The disclosed full adder circuit demonstrates improved power characteristics over conventional full adder circuits while maintaining or improving performance, for example when utilized to form 4:2 compressors, 5:2 compressors, or higher-order compressors.

This disclosure uses various terms that should be accorded the following meaning unless otherwise indicated. "Control terminal" refers to the terminal of a circuit at which a control input is applied. "Control input" refers to a signal applied to a circuit to control the operation of the circuit on transforming or passing one or more signals at its input terminals to its output terminals. "Input terminal" refers to the terminal of a circuit at which an input signal is applied. An input signal is a signal that the circuit will pass or transform to its output terminal.

"Operand input" refers to the operands of an addition operation. "Carry in" refers to a bit generated by a previous addition. This bit is set to zero if there is no previous addition (e.g., the adder circuit is the first in a series). "Carry out" refers to a bit generated to indicate that the addition of two bits resulted in a carry. "Sum output" refers to the sum bit generated by an adder circuit.

"Cell" refers to a logic 'block' (a circuit with defined inputs and outputs) that utilizes multiple gates. "Gates" as used herein refers to singular Boolean logic blocks (e.g., AND, OR, NOR, inverter etc.).

"XNOR cell" refers to a circuit that transforms the signals at its input terminals according to a NOT EXCLUSIVE OR logic table. "NAND gate" refers to a circuit that transforms the signals at its input terminals according to a NOT AND logic table. "OAI cell" refers to a circuit that transforms the signals at its input terminals according to the logic tables for OR, AND, and Invert operations.

"Output stage" refers to the stage of a circuit from which the output of the circuit emerges. The output stage often acts to provide isolation and/or drive current. "Tri-state inverter" refers to a circuit that generates one of three states on its output terminal: logical 1, logical 0, or a high-impedance state (sometimes denoted Z) that effectively isolates a circuit using the tri-state as an output stage from subsequent circuit stages. A tri-state inverter also inverts the circuit at its input terminal at its output terminal.

The full adder utilizes the output of an OAI21 gate to generate the carry out Co, and further shares the output of an XNOR2 cell as the complement (bar) propagate signal for the Co. "Propagate signal" refers to a signal, often denoted with the letter P, that is useful with carry-look-ahead adder circuits. The propagate signal is indicative of whether a carry is propagated through from a less significant bit position, generated in that bit position, or terminated in that bit position. In many cases the propagate signal is the sum output of a half adder. The propagate signal is typically used in conjunction with the generate signal (denoted G), as known in the art. The OAI21 cell generates Co when either "generate" is TRUE, or both of "propagate" and the carry in in Ci are TRUE.

Another stage of the full adder utilizes an XOR3 gate to generate the sum (S) output. The XOR3 gate is implemented using a novel pass gate structure. A conventional pass gate-type XOR3 circuit utilizes an inverter on the output and two transistors to transform the pass gate input into a tristate inverter. However, using the disclosed full adder design, when multiple full adder cells are chained via the sum S output in a 4:2 compressor (or higher-order compressors), simpler alternatives may be utilized, yielding improved power consumption and potentially improved performance over conventional full adder designs.

Figure 5:
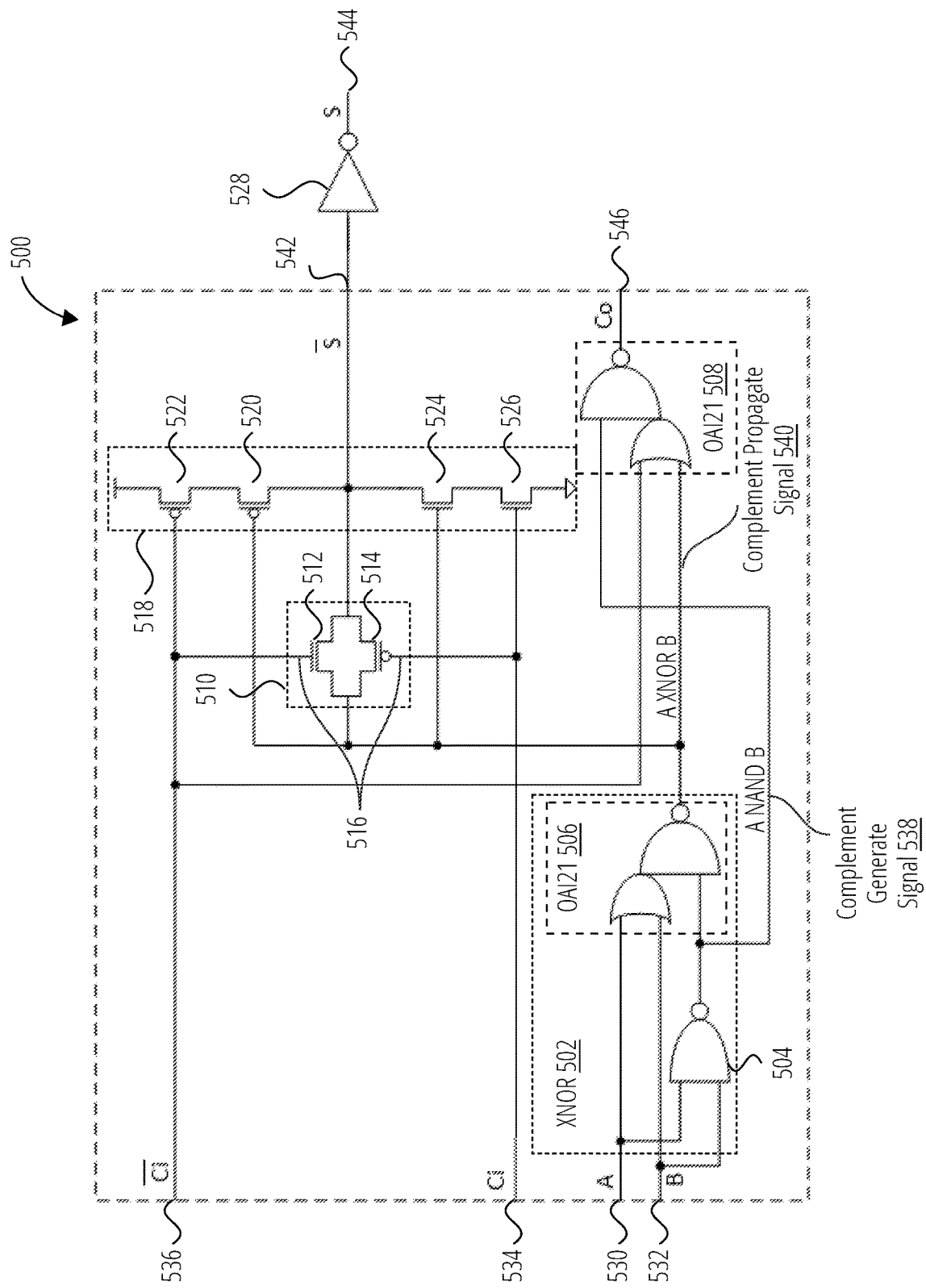
FIG. 5 depicts a full adder core circuit 500 in accordance with one embodiment.

FIG. 5 depicts a full adder core circuit 500 in one embodiment. At a high level, the full adder core circuit 500 comprises an XNOR cell 502, an OAI cell 508, a pass gate 510, a tri-state inverter 518, and an external isolation inverter 528. Four signals are input to the full adder core circuit 500. These input signals comprise an operand input 530 "A", a second operand input 532 "B", a carry in 534 "Ci", and a complement or complement carry in 536 "Ci (bar)" (i.e., "Ci" capped with a bar to indicate inversion relative to Ci). The full adder core circuit 500 generates two output signals. These output signals comprise a sum output 544 "S" and a carry out 546 "Co".

The XNOR cell 502 is constructed from a NAND gate 504 and an OAI cell 506. Each of OAI cell 506 and OAI cell 508 comprise an integrated OR function and NAND function. Although depicted functionally with distinct internal gates, OAI cells need not comprise separate distinct gates for OR and NAND; rather, an integrated transistor structure, known in the art, may implement the OAI functionality overall without implementing distinct OR and NAND gates internally. It should be understood that references to logic gates such as OR, NAND, etc. do not necessarily mean the logic is implemented as distinct gates, as integration of the gate structures may sometimes be utilized; however for ease of reference such logic may be referred to herein as being "gates". Conceptually (not necessarily in the circuit layout), of the three inputs to the OAI cell, two of them act as inputs to the OR gate. The third, along with the OR function output, are the two inputs to the NAND gate. The NAND gate output generated from these three inputs is the output of the OAI cell.

The pass gate 510 may comprise two transistors, which may be field effect transistors (FETs). One transistor is a P-channel FET (PFET), and the other transistor is an N-channel FET (NFET). The pass gate 510 is formed when the source terminals of PFET 514 and NFET 512 are connected together, their drain terminals are also connected together, and the gates act as control terminals 516 and are each connected to one of a signal and its complement.

The tri-state inverter 518 may be constructed from two PFETs and two NFETS. PFET 520 and PFET 522 are arranged in series with the drain terminal of PFET 522 connected to power and the source terminal of PFET 520 connected to the tri-state inverter 518 output terminal. NFET 524 and NFET 526 are arranged in series with the drain terminal of NFET 526 connected to ground and the source terminal of NFET 524 connected to the tri-state inverter 518 output terminal. The PFET and NFET pairs may be swapped in some embodiments without altering the circuit macro-behavior.

In the depicted embodiment, the A and B inputs are coupled directly to the XNOR cell 502. The A and B inputs are gated by the NAND gate 504 to create a complement generate signal 538 that can be logically expressed as A NAND B. This complement generate signal 538, along with inputs A and B, comprise the inputs to the OAI cell 506. The A and B operands are input to the OAI cell 506 OR gate. The OR gate output and the complement generate signal 538 are input to the OAI cell 506 NAND gate. The output of the OAI cell 506 NAND gate forms the output of the entire XNOR cell 502, and may be logically expressed as A XNOR B, and which functions as a complement propagate signal 540.

The OAI cell 508 accepts the A XNOR B signal as a complement propagate signal 540 at one of the inputs to its OR gate stage. The other OAI cell 508 OR gate input is the complement carry in 536 signal Ci(bar). The OAI cell 508 OR gate output and the complement generate signal 538 A NAND B form the two inputs to the OAI cell 508 NAND gate. The output of OAI cell 508 is the full adder core circuit 500 carry out 546 output Co.

The A XNOR B signal is further used as an input to the pass gate 510. The A XNOR B signal is connected to the source terminals of the PFET and NFET components of the pass gate 510. The gate terminal of the NFET is connected to Ci(bar), and the gate terminal of the PFET is connected to Ci. The coupled drains of the PFET and NFET provide the pass gate 510 output. In this configuration, when Ci is a logical "0" and Ci(bar) is a logical "1", the A XNOR B value is passed through the pass gate 510 as its output. When Ci is a logical "1" and Ci(bar) is a logical "0", the pass gate 510 is closed, and present as an open switch to circuitry downstream from it. The A XNOR B signal is finally coupled to the tri-state inverter 518 through a connection to the gate terminals of both NFET 524 and PFET 520. Ci is coupled to the gate of NFET 526 and Ci(bar) is coupled to the gate of PFET 522. When Ci is a logical "0" and Ci(bar) is a logical "1", the inverter transistors present as open switches. When Ci is a logical "1" and Ci(bar) is a logical "0", the output of the tri-state inverter 518 present as the complement of A XNOR B. In this manner, the output terminals of the pass gate 510 and tri-state inverter 518 provide the S(bar) or complement sum output 542 as either the A XNOR B value or its complement, based on the logical value of Ci. An external isolation inverter 528 may be coupled to the complement sum output 542 to provide sum output 544 S. It may be noted that, in this configuration, When Ci is a logical "0", the output terminal S(bar) of the full adder core circuit 500 receives A XNOR B through the pass gate 510 (the tri-state inverter 518 appearing as an open switch), and when Ci is a logical "1", the output terminal S(bar) of the full adder core circuit 500 receives the complement of A XNOR B through the tri-state inverter 518 (the pass gate 510 appearing as an open switch). Pass gate 510 and tri-state inverter 518 together implement an EXCLUSIVE OR transformation on complement propagate signal 540 (A XNOR B) and carry in 534 (Ci), on complement sum output 542 S(bar). When the complement sum output 542 is inverted by external isolation inverter 528, the sum output 544 is generated, equivalent to the complement of XOR (Ci, XNOR (A,B)), which is equivalent to a three input XOR(A, B, Ci), the desired full adder sum output.

The disclosed circuitry is arranged in a novel way, such that some signals are shared between different logic stages. The complement generate signal 538 output from NAND gate 504 is used as an input to the NAND gates of both OAI cell 506 and OAI cell 508. The A XNOR B output from OAI cell 506 is used as an input to OAI cell 508, pass gate 510, and two of the transistor gate terminals comprised in tri-state inverter 518. Ci(bar) is shared by OAI cell 508, pass gate 510, and tri-state inverter 518. Sharing these signaling nodes may enable a simplified transistor configuration involving fewer transistors.

An inverter in one embodiment may be built using two transistors. An OAI cell may be built with six transistors. A NAND gate may utilize four transistors. A design for a full adder taking advantage of the configuration illustrated here may be designed using twenty-six transistors, while conventional full adders (e.g., mirror adders) may utilize twenty-eight transistors. Using fewer transistors may reduce the area needed on-chip for each of multiple full adder circuits. Fewer transistors may also result in a reduced power draw and faster operation.

Figure 6:
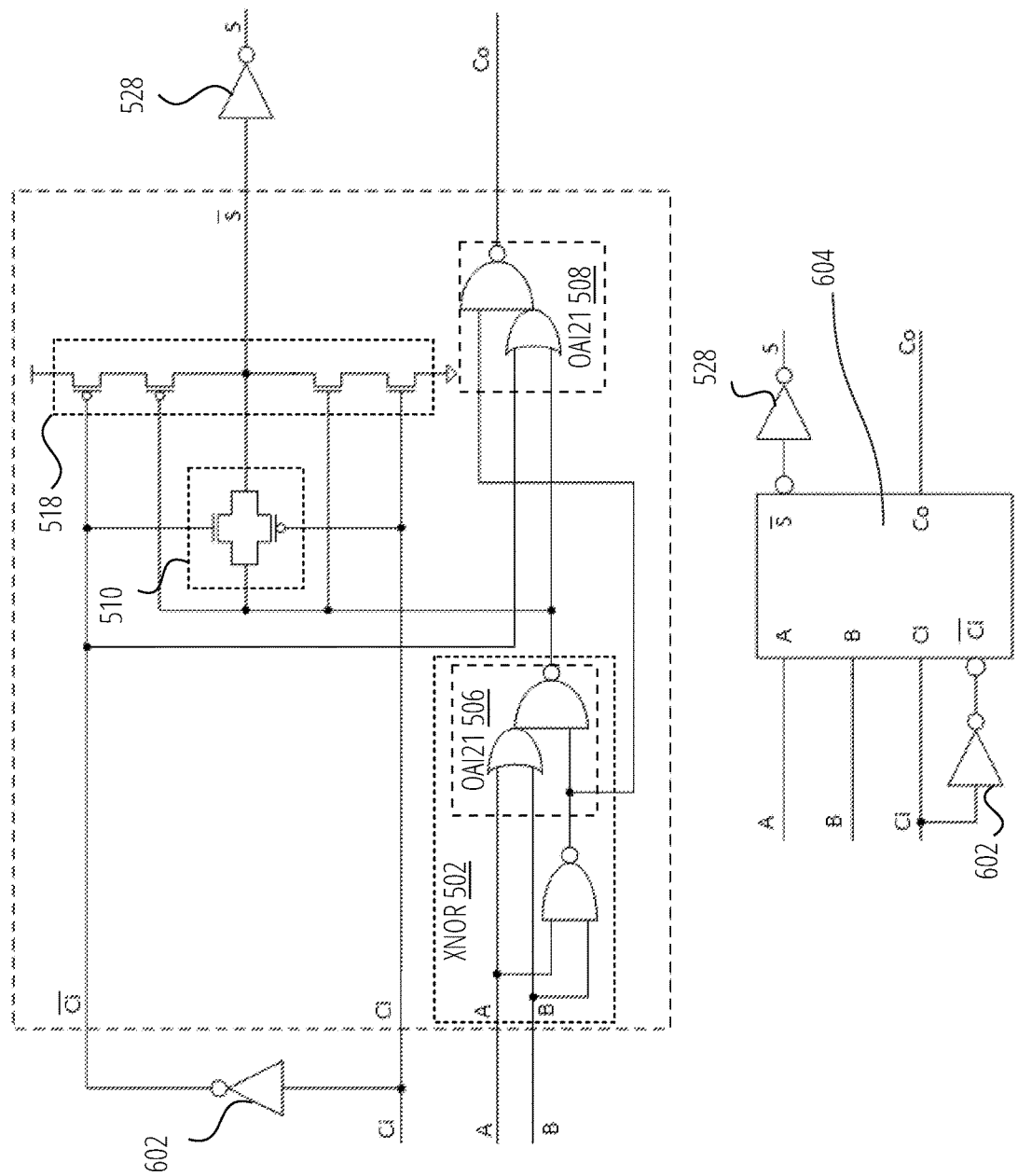
FIG. 6 depicts the full adder core circuit 500 in accordance with another embodiment.

FIG. 6 depicts the use of external inverter 602 with full adder core circuit 500 in one embodiment. A package symbol 604 for the full adder core circuit 500 is also depicted.

The external inverter 602 may be coupled between the Ci and Ci(bar) inputs of the adder circuit as shown, such that a carry in (Ci) signal from additional circuitry is inverted and provided to the adder circuit as Ci(bar). This inverter is considered "external" in that it is a component not considered an element of the full adder core, but rather provides a post-hoc correction to the polarities of Ci and Ci(bar) to subsequent circuit stages. For a full adder core circuit 500 packaged as a standalone IC, with a minimum of six input/output pins as shown in package symbol 604, the external inverter 602 may be included, like the external isolation inverter 528, as an additional physical component.

Figure 7:
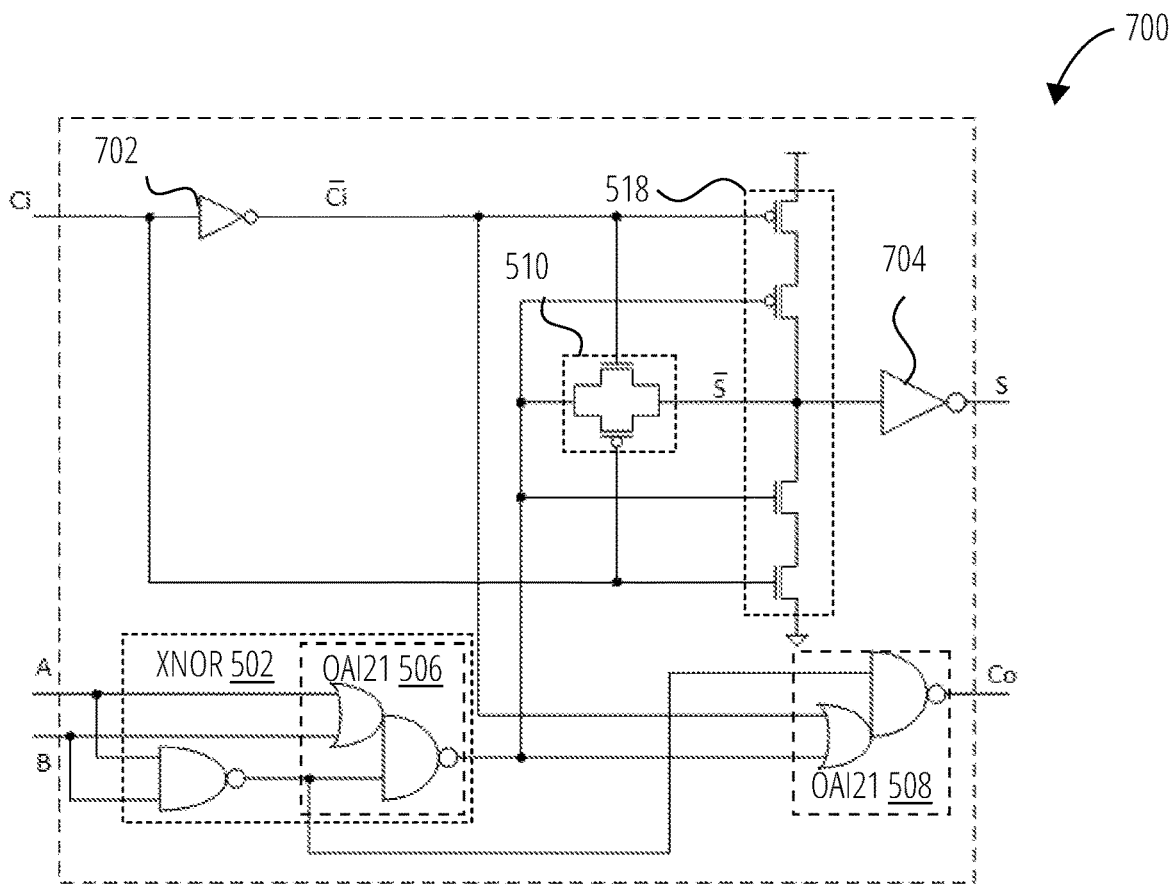
FIG. 7 depicts a full adder circuit 700 in accordance with one embodiment.
Figure 7:
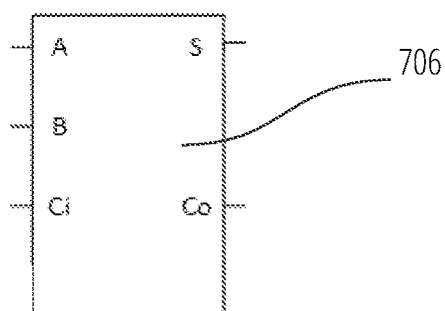

FIG. 7 depicts a full adder circuit 700 with internal inverters internal inverter 702 and internal isolation inverter 704 in one embodiment. A package symbol 706 for the full adder circuit 700 is also depicted.

The full adder circuit 700 is similar in many respects to the full adder core circuit 500 but also differs in the following respects. Instead of the external isolation inverter 528 introduced in FIG. 5 and the external inverter 602 introduced in FIG. 6, the full adder circuit 700 incorporates these inverters as part of the adder circuitry.

This may be evidenced in observing the difference in package pinout between package symbol 604 and package symbol 706. Where package symbol 604 has both Ci and Ci(bar) inputs and S(bar) output, package symbol 706 has a single Ci input and an S output. This is due to internal inverter 702 being incorporated into the adder circuitry, coupled between the Ci input and the Ci(bar) internal signal. Internal isolation inverter 704 is additionally coupled between S(bar), in this embodiment an internal signal, and the S output. In other respects, Ci, Ci(bar), A, and B inputs may be utilized as depicted in the full adder core circuit 500 to generate the S(bar) signal.

As a result, for a full adder circuit 700 packaged as a standalone IC, a minimum of five input/output pins are needed, as shown in package symbol 706. In this embodiment, no additional circuit elements are needed to generate a sum output S from the A and B operand inputs and the Ci carry in input. The two embodiments illustrated as full adder core circuit 500 using two external inverters and full adder circuit 700 using two internal inverters are merely examples for constructing a full adder circuit. Depending on the desired implementation of the adder circuit in the context of additional circuitry, either inverter may be incorporated as an internal or external component or omitted altogether.

Figure 8:
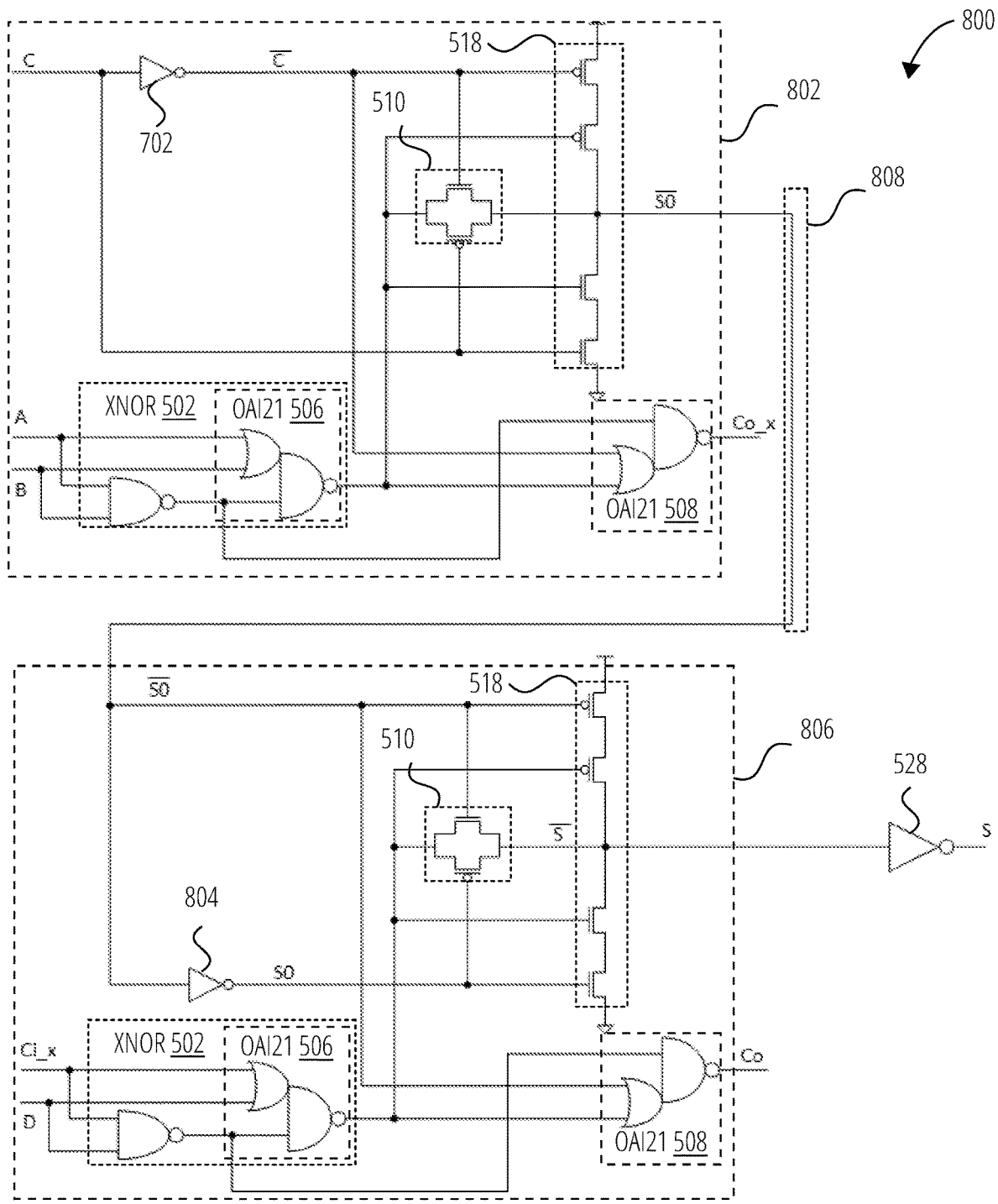
FIG. 8 depicts a 4:2 compressor circuit 800 in accordance with one embodiment.

FIG. 8 depicts a 4:2 compressor circuit 800 in one embodiment. The 4:2 compressor circuit 800 comprises two full adder circuits that are similar in many respects to the full adder circuit 700 described previously. The first full adder cell 802 has an internal inverter 702 coupled to transform the carry in input C to a complement carry in C (bar) signal at the inverter output. The inverted sum output signal S0(bar) of the full adder cell 802 is coupled to the inverted carry in input of the second full adder cell 806 with no intervening output inverter (output path with no intervening inverter 808). "Intervening inverter" refers to an inverter circuit placed between two circuit elements to invert the signal as it passes between the elements. The internal inverter 804 of the second full adder cell 806 generates an S0 internal "true polarity" (not inverted) carry in signal. The result is that first full adder cell 802 is configured to produce an inverted polarity sum output, whereas the second full adder cell 806 is configured to accept an inverted polarity carry in signal, resulting in correct (true) polarity for the sum output (S) of the 4:2 compressor circuit 800.

The full adder cell 802 and the second full adder cell 806 differ from the full adder circuit 700 in the following respects. The 4:2 compressor circuit 800 accepts four operand inputs: A, B, C, and D, and a carry in input Ci_x. The 4:2 compressor circuit 800 generates three output signals: the sum output S and the carry out outputs Co_x and Co. The carry in adder input of full adder circuit 700 is coupled to the C operand input to the 4:2 compressor circuit 800. The internal inverter 702 is used to generate C(bar), which is coupled to a PFET of the tri-state inverter 518, analogously to how Ci(bar) is coupled in the full adder circuit 700. The A and B operand inputs are also coupled as shown in full adder circuit 700. These three operand inputs are used to generate the S0(bar) and Co_x outputs, which correspond to the So(bar) and Co signals of the full adder circuit 700. Full adder cell 802, however, lacks the external isolation inverter 528 of full adder circuit 700, because rather than providing a sum output, full adder cell 802 provides an internal, intermediate S0(bar) signal that is applied in the next stage of the 4:2 compressor circuit 800. Co_x is, similarly, provided as an intermediate carry out output without further internal alteration.

Second full adder cell 806 differs from full adder circuit 700 and full adder cell 802 in that rather than coupling a carry in signal to an NFET of the tri-state inverter 518 and an inverted carry in to a tri-state inverter 518 PFET, the S0(bar) signal generated by the full adder cell 802, used as the input to the functional carry in (S(bar)) portion of the second full adder cell 806, is coupled directly to a tri-state inverter 518 PFET, and the S0 output of the internal inverter 804 is coupled to a tri-state inverter 518 NFET. The A input of full adder circuit 700 and full adder cell 802 is coupled to a carry in signal for the 4:2 compressor circuit 800, Ci_x. The B input of full adder circuit 700 and full adder cell 802 is coupled to the fourth operand input D. The So(bar), Ci_x, and D inputs to the second full adder cell 806 are used to generate the S(bar) and C0 outputs, as was shown with regard to full adder core circuit 500. An external isolation inverter 528 is incorporated to provide the sum output S, also s shown for full adder core circuit 500.

In this manner, two full adder circuits may be staged together with output path with no intervening inverter 808 to form a 4:2 compressor circuit 800. The 4:2 compressor circuit 800 accepts A, B, C, and D operand inputs and a Ci_x carry in. The 4:2 compressor circuit 800 generates Co_x and Co carry outs and the S sum output.

Figure 9:
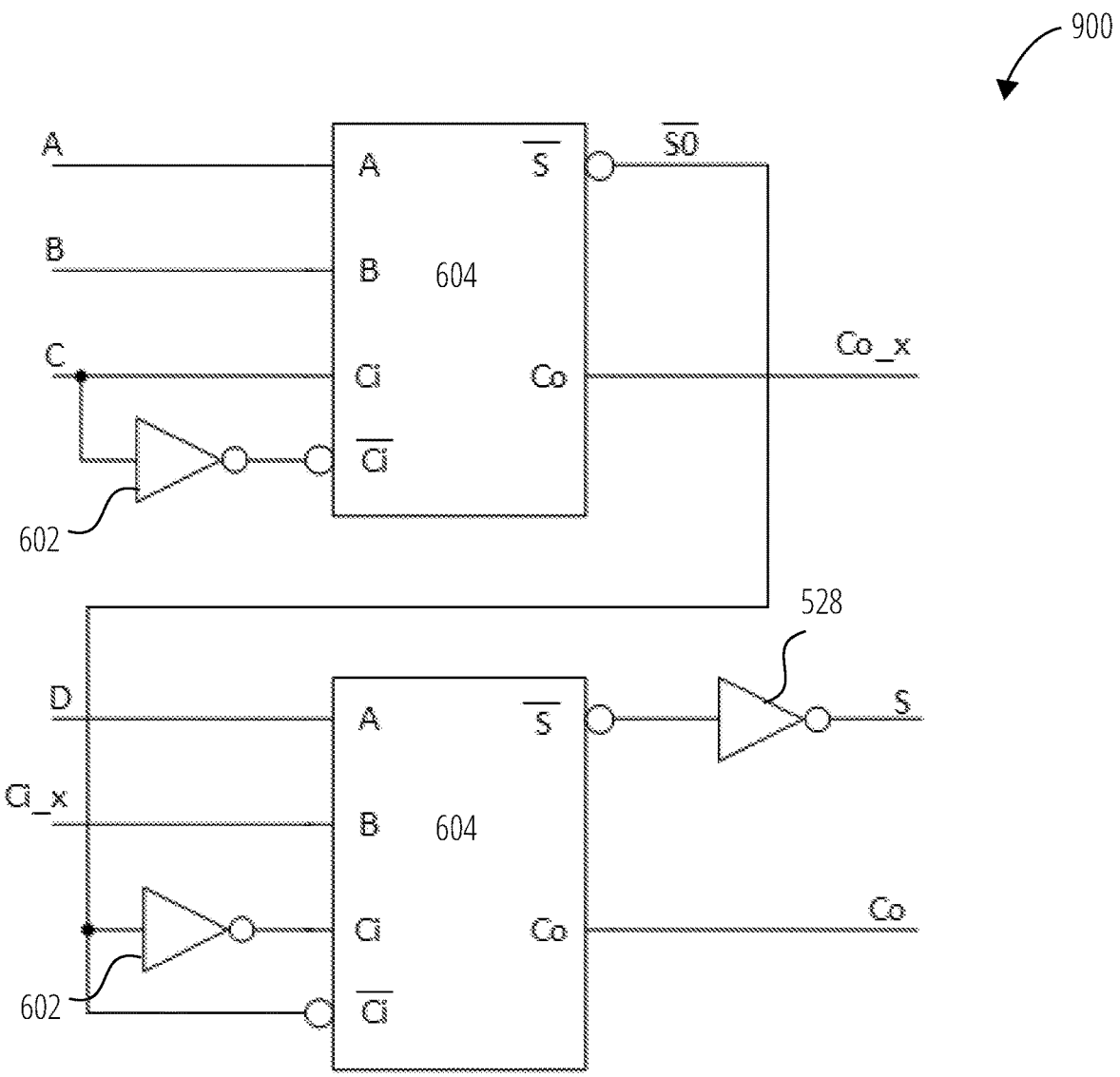
FIG. 9 depicts a 4:2 compressor circuit 900 in accordance with one embodiment.

FIG. 9 depicts, at a package symbol level, the use of two of the full adder core circuit 500 embodiments to implement a 4:2 compressor circuit 900.

Figure 10:
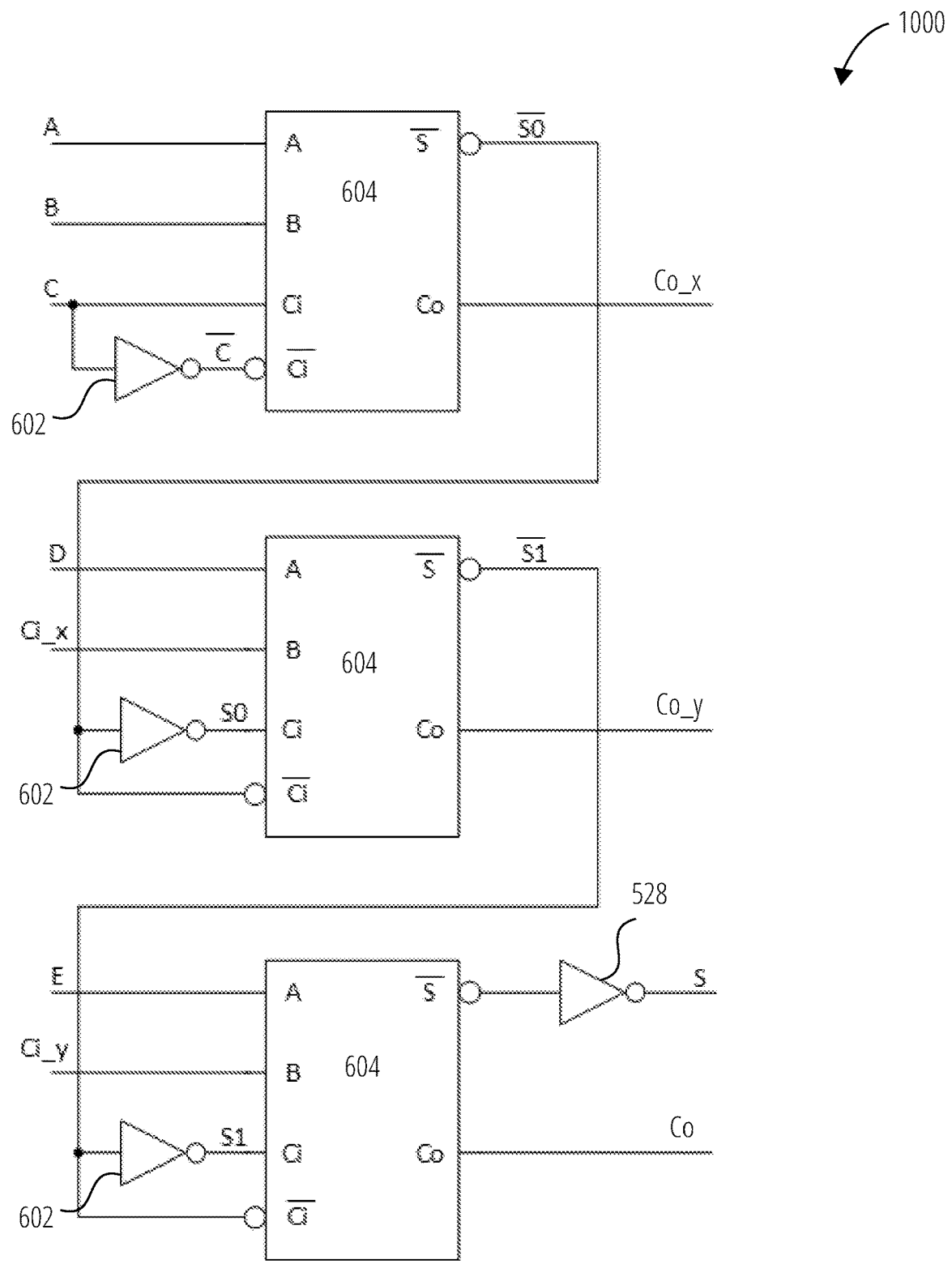
FIG. 10 depicts a 5:2 compressor circuit 1000 in accordance with one embodiment.

FIG. 10 depicts, at a package symbol level, the use of three of the full adder core circuit 500 embodiments to implement a 5:2 compressor circuit 1000.

Figure 11:
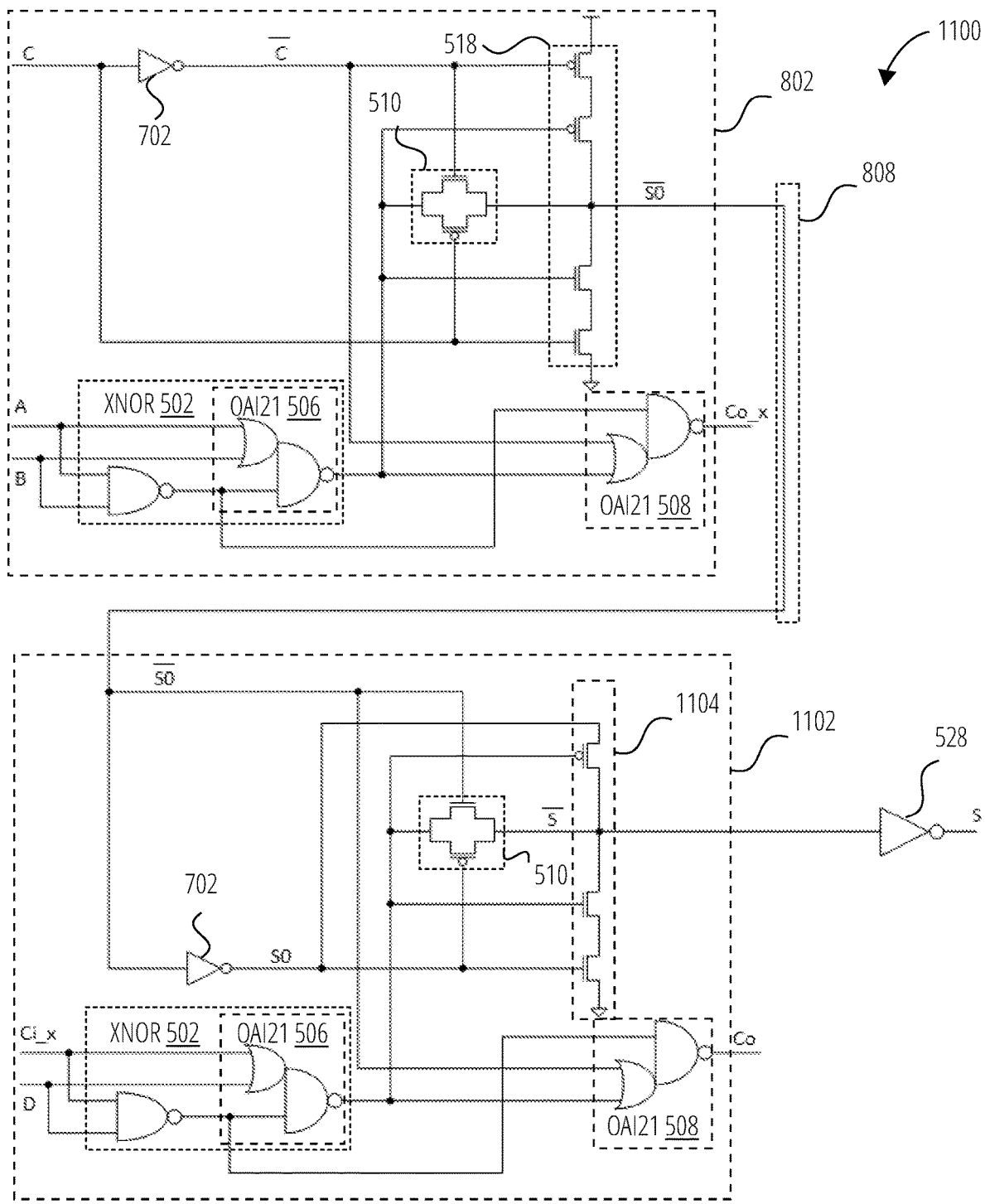
FIG. 11 depicts an alternative 4:2 compressor circuit 1100 in accordance with one embodiment.

FIG. 11 depicts an alternative 4:2 compressor circuit 1100 in one embodiment. The alternative 4:2 compressor circuit 1100 comprises two full adder circuits that are similar in many respects to those utilized in the 4:2 compressor circuit 800 described previously. The inverted sum output of the full adder cell 802 is coupled to the sum input of the second full adder cell 1102 with output path with no intervening inverter 808.

The second full adder cell 1102 differs from the full adder cell 802 in the following respects. An alternative output stage FET stack 1104 is used instead of the tri-state inverter 518 illustrated in the previous adder circuits. The alternative output stage FET stack 1104 incorporates two NFETs coupled between ground and the S(bar) sum output, as previously seen. Two or more field effect transistors arranged so that their channels are in series. The S0 internal signal generated by connecting S0(bar) to an internal inverter 702 is coupled to the gate of one NFET, and the output of XNOR cell 502 is coupled to the gate of the other NFET. This remains similar to the tri-state inverter 518 illustrated. However, the two PFETs coupled between power and the output terminal seen in the tri-state inverter 518 are replaced in the alternative output stage FET stack 1104 by a single PFET with its source coupled to S0, its drain coupled to the output terminal, and its gate coupled to the output of XNOR cell 502. In this configuration, the alternative output stage FET stack 1104 may provide a functionally and logically similar S(bar) behavior while using one fewer transistor than the tri-state inverter 518.

Figure 12:
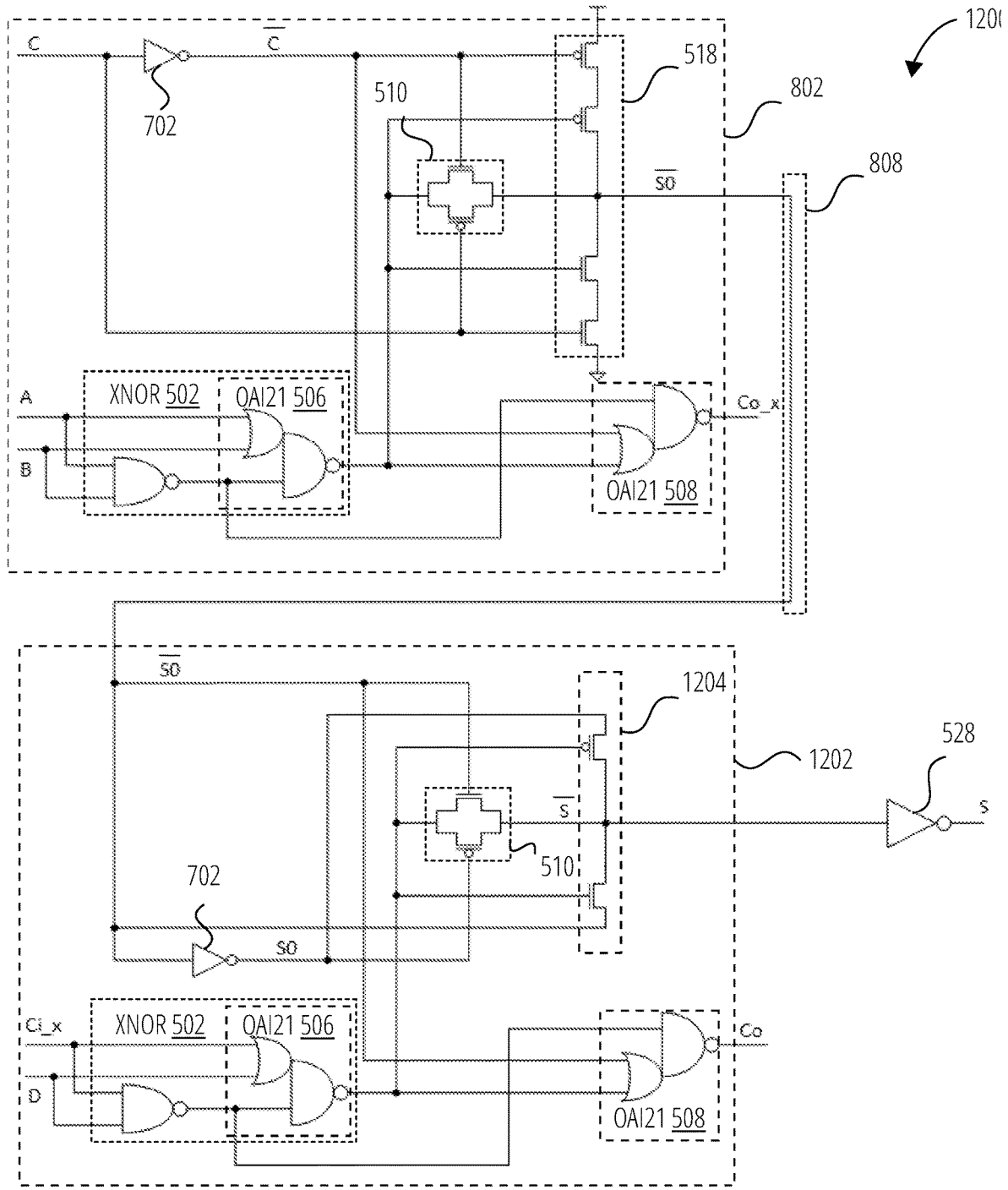
FIG. 12 depicts an alternative 4:2 compressor circuit 1200 in accordance with one embodiment.

FIG. 12 depicts an alternative 4:2 compressor circuit 1200 in one embodiment. The alternative 4:2 compressor circuit 1200 comprises two full adder circuits that are similar in many respects to those utilized in the 4:2 compressor circuit 800 and the alternative 4:2 compressor circuit 1100 described previously. The inverted sum output of the full adder cell 802 is coupled to the sum input of the second full adder cell 1202 with output path with no intervening inverter 808.

The second full adder cell 1202 differs from the full adder cell 802 in the following respects. The alternative output stage FET stack 1204 of the second full adder cell 1202 uses a single PFET with its source coupled to S0(bar), its gate coupled to the XNOR cell 502 output, and its drain forming the S(bar) output terminal, similar to alternative output stage FET stack 1104. In addition, the alternative output stage FET stack 1204 uses a single NFET with it's source coupled to S0(bar), its gate coupled to the XNOR cell 502 output, and its drain coupled to the S(bar) output, rather than the two NFETs coupled between ground and S(bar), seen in the tri-state inverter 518. Thus the alternative output stage FET stack 1204 uses two fewer transistors than tri-state inverter 518, further reducing the number of transistors needed for the alternative 4:2 compressor circuit 1200 solution, and thus further reducing the on-chip area and power needed to implement this logic on an IC.

Figure 13:
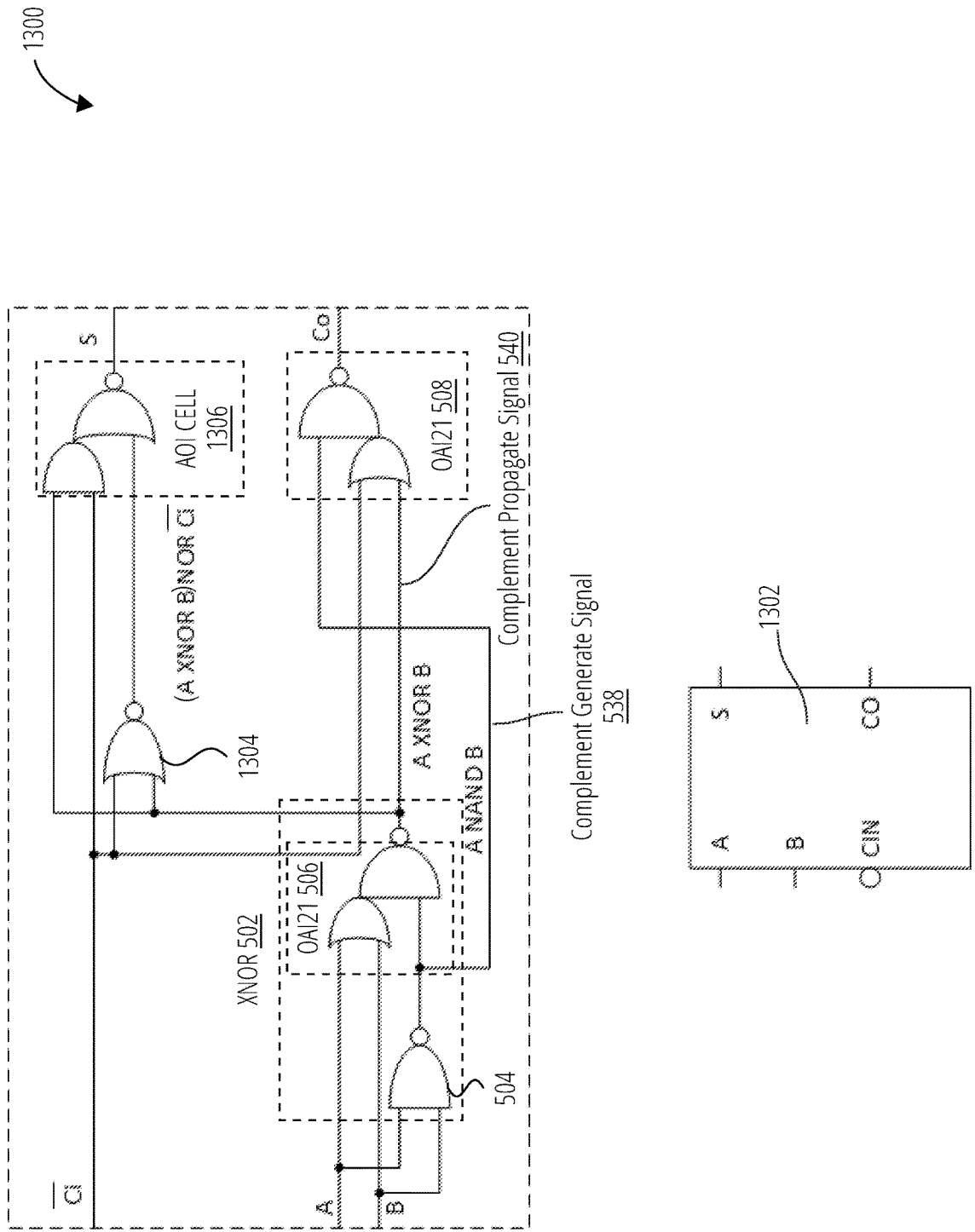
FIG. 13 illustrates a full adder core circuit 1300 in accordance with one embodiment.
Figure 14:
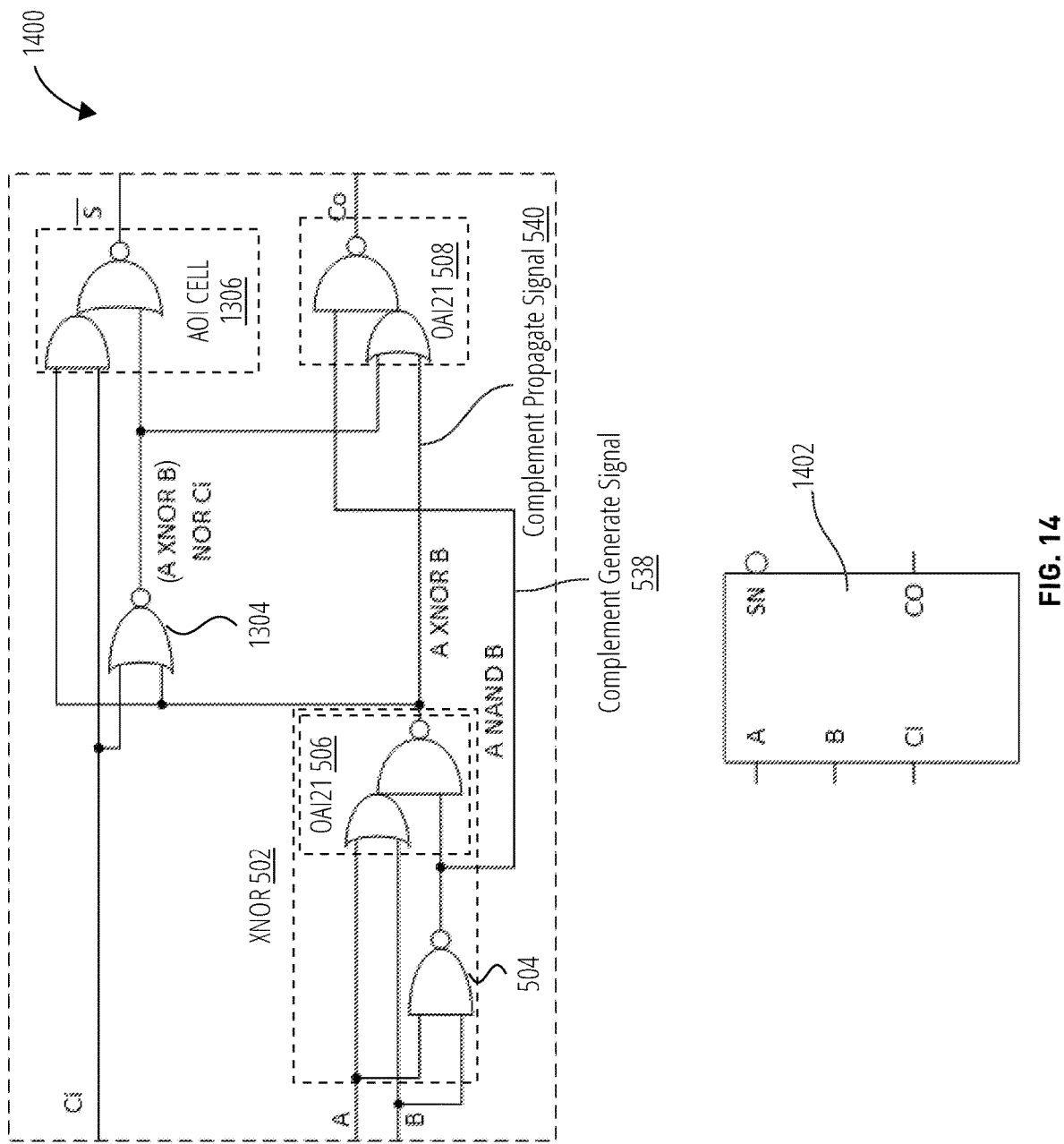
FIG. 14 illustrates a full adder core circuit 1400 in accordance with one embodiment.

FIG. 13 and FIG. 14 depict alternative embodiments of a full adder core circuit. Generally, each embodiment includes an XNOR cell comprising a first OAI cell, and a second OAI cell. The XNOR cell is configured to transform a first operand input and a second operand input into a complement propagate signal applied to each of the second OAI cell and an AOI cell. "AOI cell" refers to a circuit that transforms the signals at its input terminals according to the logic tables for AND, OR, and Invert operations. Specifically, the second OAI cell transforms the complement propagate signal and a complement generate signal output from the XNOR cell 502 into a carry out signal. The AOI cell transforms a third operand input and the complement propagate signal into a sum output signal.

FIG. 13 depicts a full adder core circuit 1300 and corresponding package symbol 1302 in a first alternative embodiment. The full adder core circuit 1300 is similar is some aspects to the full adder core circuit 500 described previously but also differs in the following respects. In the full adder core circuit 500, the sum output 544 is generated using a pass gate 510, a tri-state inverter 518, and an external isolation inverter 528, which receive both the carry in 534 and complement carry in 536 signals as input. This leads to the use of an inverter (e.g., external inverter 602 or internal inverter 702) in order for both signals to be present. The full adder core circuit 1300, in contrast, utilizes a NOR gate 1304 and a AOI cell 1306 to generate the sum output. The full adder core circuit 1300 does not necessitate the generation of both the carry in signal and the complement carry in signal.

The NOR gate 1304 inputs are coupled to the complement propagate signal 540 (the output of the first OAI cell 506) and the complement carry in signal. The NOR gate 1304 output is coupled to the AOI cell 1306 input, along with the complement carry in and complement propagate signal 540. The combination of the NOR gate 1304 and the AOI cell 1306 forms an XOR logic block that generates the sum output without need for the external isolation inverter 528. The AOI cell 1306 provides isolation to the sum signal, preventing signal back flow when the sum output is coupled to an additional logic stage.

The full adder core circuit 1300 uses the second OAI cell 508 to transform the carry in signal, the complement generate signal 538, and the complement propagate signal 540 into the carry out signal.

By using the NOR gate 1304 and the AOI cell 1306 instead of the pass gate 510, tri-state inverter 518, and external isolation inverter 528, the layout of the gates on the silicon die may exhibit reduced area (i.e., take up reduced space on the die) and/or generally be more conducive to layout. The full adder core circuit 1300, full adder core circuit 1400, and full adder core circuit 500 may each include an equivalent number of transistors. However, present design layout rules discourage the locating of PMOS and NMOS transistors utilized for the pass gate 510 and tri-state inverter 518 within a certain proximity to one other. The layout for these circuits may thus typically be accomplished by connecting to two different poly tracks, effectively doubling the layout area needed for an equivalent number of transistors. Using the NOR gate 1304 and AOI cell 1306, heterogeneous transistor types are not required, saving area and potentially reducing latency and power consumption as well.

FIG. 14 depicts a full adder core circuit 1400 and corresponding package symbol 1402 in a second alternative embodiment. The full adder core circuit 1400 is similar is some aspects to the full adder core circuit 1300 but also differs in the following respects. While similar circuit components are used in both embodiments, the full adder core circuit 1400 depicted in FIG. 14 receives the un-complemented carry in signal not the complemented carry in. As a result, the output is a complemented sum output signal, not he un-complemented sum output generated by the full adder core circuit 1300 in FIG. 13.

In the full adder core circuit 1400 the un-complemented carry in signal is applied to the inputs of the 1304, the second OAI cell 508, and the AOI cell 1306. The second OAI cell 508 also inputs the output of the NOR gate 1304. In this manner, the second OAI cell 508 generates the carry out in both the full adder core circuit 1300 and the full adder core circuit 1400. The NOR gate 1304 and the AOI cell 1306 accept the complement propagate signal 540 in both embodiments. However the output of the AOI cell 1306 in the full adder core circuit 1400 is a complemented sum, in contrast with the (un-complemented) sum output of the AOI cell 1306 of the full adder core circuit 1300.

Advantages to using the un-complemented carry in may be twofold. First, generating a complement sum output as an input to a second stage of circuitry may increase adder efficient in that it does not utilize an intervening inverter. Second, by using the un-complemented carry in, the output of the NOR gate 1304 represents, effectively, the complemented carry in input to the OAI cell 508 for values of the carry in input that affect the outputs. The complemented carry in is effectively generated without requiring additional logic such as an internal inverter.

In some embodiments, some additional latency may be incurred by generating the complement carry in through the NOR gate 1304 rather than using an inverter. However the reduction in layout area achieved may outweigh the detriment to the latency.

Figure 15:
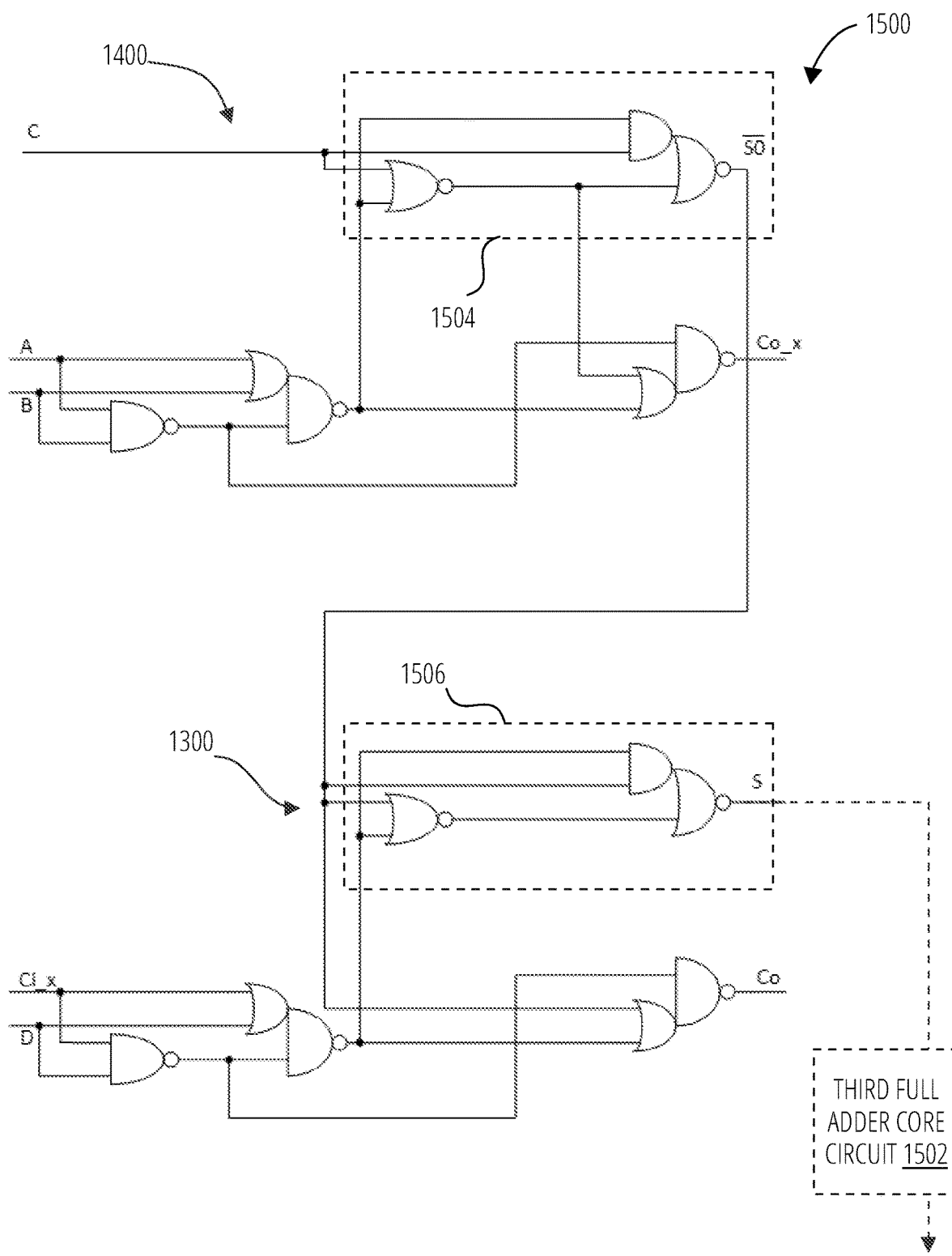
FIG. 15 illustrates a 4:2 compressor circuit 1500 in accordance with one embodiment.

FIG. 15 depicts a 4:2 compressor circuit 1500 that includes the full adder core circuit 1400 as a first stage and the full adder core circuit 1300 as a second stage. Generally, each full adder includes similar internal logic components coupled in different ways. One of ordinary skill in the art may readily ascertain how additional adder stages of these types may be added to form higher-order compressors (e.g., the third full adder core circuit 1502 coupled to the sum output of the second full adder core circuit 1300, etc.).

In the 4:2 compressor circuit 1500 no intervening inverter is needed between the complement sum output that is generated by the XOR cell 1504 of the full adder core circuit 1400 to the full adder core circuit 1300. The XOR cell 1506 in the full adder core circuit 1300 generates an un-complemented sum output.

The 4:2 compressor circuit 1500 obtains of the benefits of both of the full adder core circuit 1300 and full adder core circuit 1400 configurations. The un-complemented carry in to the full adder core circuit 1400 yields a complemented sum output to the full adder core circuit 1300, where it is transformed into an overall un-complemented sum output. The full adder core circuit 1400 and full adder core circuit 1300 may be chained together with no intervening inverters and may thus exhibit improved area, layout, and/or latency.

Figure 16:
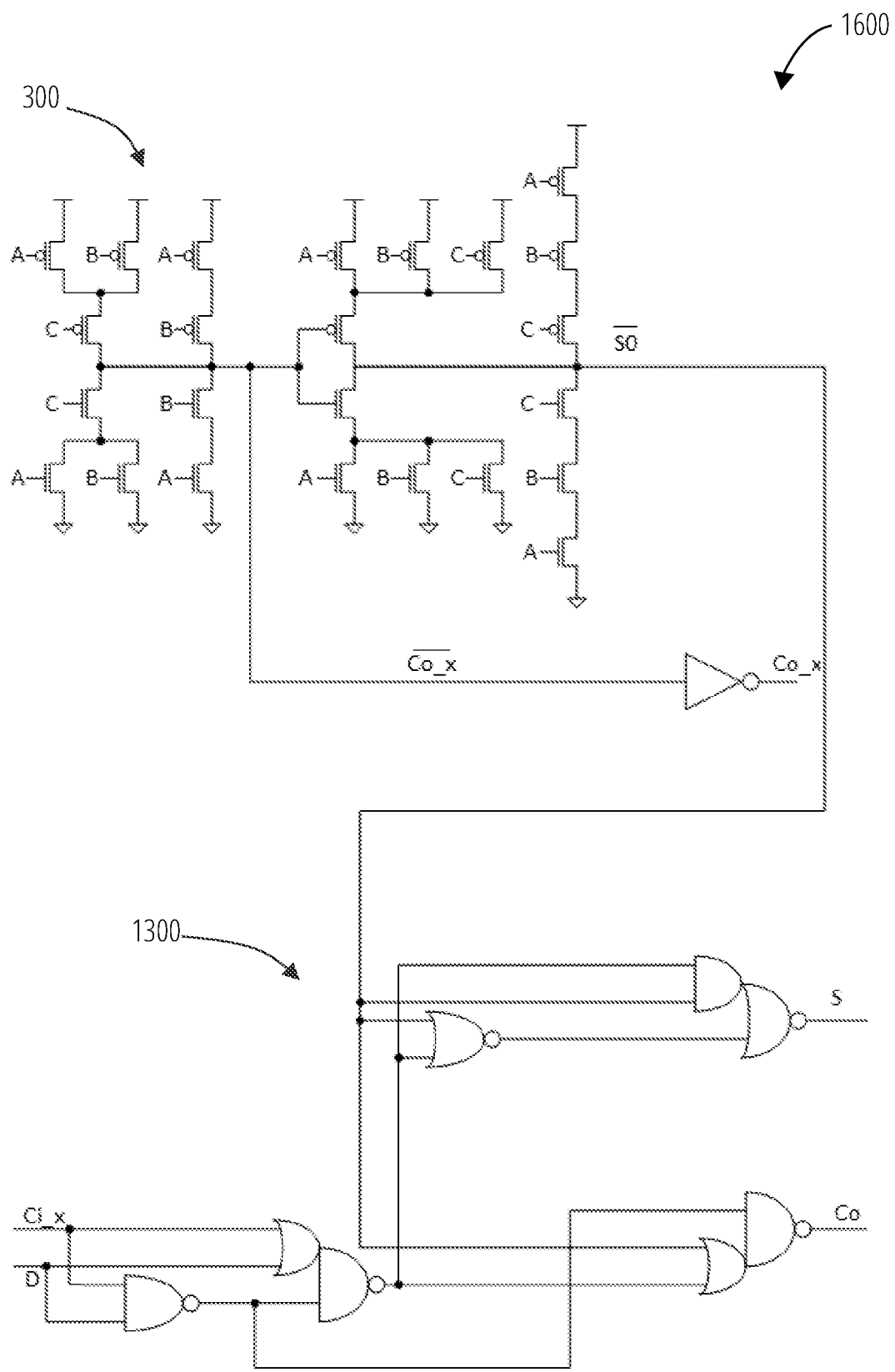
FIG. 16 illustrates a 4:2 compressor circuit 1600 in accordance with one embodiment.

FIG. 16 depicts a 4:2 compressor circuit 1600 that includes a conventional full adder circuit 300 first stage and the full adder core circuit 1300 described previously as a second stage. The full adder core circuit 1300 comprises a first operand input and a carry in input to both of a NAND gate and a first OAI cell. A second OAI cell transforms outputs of the NAND gate and the first OAI cell into a carry out signal of the second stage. An AOI cell and a NOR gate are utilized to transform outputs of the first OAI cell and the complement sum signal from the conventional full adder circuit 300 into an un-complemented sum output signal.

By using the conventional full adder circuit 300 in conjunction with the full adder core circuit 1300, some of the layout benefits from full adder core circuit 1300 may be gained. The timing characteristics of both the conventional full adder circuit 300 and the full adder core circuit 1300 may be better than those seen with the full adder core circuit 1400. By using the conventional full adder circuit 300 and full adder core circuit 1300 together, the signal polarities may be such that the layout improvements may be leverages while not incurring as much delay as might be seen with the 4:2 compressor circuit 1500.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. An adder circuit comprising:
   a first operand input and a second operand input to an XNOR cell;
   an OAI cell transforming an output of the XNOR cell into a carry out signal; and
   an XOR cell comprising a NOR gate and an AOI cell configured to transform a third operand input and the output of the XNOR cell into a sum output signal.

2. The adder circuit of claim 1, wherein the XNOR cell comprises a NAND gate coupled to an input of the OAI cell.

3. The adder circuit of claim 1, wherein an output of the NOR gate is coupled to an input of the AOI cell.

4. The adder circuit of claim 1, wherein an output of the NOR gate is coupled to an input of the OAI cell.

5. The adder circuit of claim 1, wherein the third operand input is a complement operand input.

6. The adder circuit of claim 1, wherein the third operand input is an un-complemented operand input.

7. The adder circuit of claim 1, wherein the sum output signal is an un-complemented sum output signal.

8. The adder circuit of claim 1, wherein the sum output signal is a complement sum output signal.

9. A compressor circuit comprising:
   a first full adder;
   a second full adder; and
   each full adder comprising:
      a first operand input and a second operand input to both of a NAND gate and a first OAI cell;
      a second OAI cell to transform outputs of the NAND gate and the first OAI cell into a carry out signal; and
      an output stage comprising an AOI cell to transform outputs of the first OAI cell and a third operand input into a sum output signal.

10. The compressor circuit of claim 9, wherein a sum output of the first full adder is applied to an input stage of the second full adder without an intervening inverter.

11. The compressor circuit of claim 10, wherein the sum output is a complement sum output.

12. The compressor circuit of claim 9, further comprising:
   a third full adder coupled to a sum output of the second full adder.

13. An adder circuit comprising:
   an XNOR cell;
   an OAI cell;
   an AOI cell; and
   the XNOR cell configured to transform a first operand input and a second operand input into a propagate signal applied to each of the OAI cell and the AOI cell.

14. The adder circuit of claim 13, the XNOR cell further configured to output a generate signal.

15. The adder circuit of claim 14, the OAI cell configured to transform the propagate signal and the generate signal into a carry out signal.

16. The adder circuit of claim 14, the OAI cell further configured to receive a third input.

17. The adder circuit of claim 16, wherein the third input is a third operand input of the adder circuit.

18. The adder circuit of claim 16, wherein the third input is the propagate signal NORed with a third operand input of the adder circuit.

19. A compressor circuit comprising:
   a first full adder;
   a second full adder; and
   the second full adder comprising:
      a first operand input and a carry in input to both of a NAND gate and a first OAI cell;
      a second OAI cell transforming outputs of the NAND gate and the first OAI cell into a carry out signal; and
      an AOI cell transforming outputs of the first OAI cell and a complement sum input signal into a sum output signal.

\* \* \* \* \*